(«12») United States Patent
Farooq et al.

(10) Patent No.: US 11,545,444 B2
(45) Date of Patent: Jan. 3, 2023

(54) MITIGATING COOLDOWN PEELING STRESS DURING CHIP PACKAGE ASSEMBLY

(71) Applicant: International Business Machines Corporation, Armonk, NY (US)

(72) Inventors: Mukta Ghate Farooq, Hopewell Junction, NY (US); Katsuyuki Sakuma, Fishkill, NY (US); Krishna R. Tunga, Wappingers Falls, NY (US); Hilton T. Toy, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/139,313

(22) Filed: Dec. 31, 2020

(65) Prior Publication Data
US 2022/0208693 A1    Jun. 30, 2022

(51) Int. Cl.
*H01L 23/367* (2006.01)
*H01L 23/373* (2006.01)
*H01L 23/31* (2006.01)
*H01L 21/48* (2006.01)
(Continued)

(52) U.S. Cl.
CPC ........ *H01L 23/562* (2013.01); *H01L 21/4853* (2013.01); *H01L 21/4882* (2013.01); *H01L 21/563* (2013.01); *H01L 23/3157* (2013.01); *H01L 23/3675* (2013.01); *H01L 23/3737* (2013.01); *H01L 24/13* (2013.01); *H01L 24/16* (2013.01); *H01L 2224/13147* (2013.01); *H01L 2224/13155* (2013.01); *H01L 2224/16225* (2013.01); *H01L 2924/18161* (2013.01); *H01L 2924/35121* (2013.01)

(58) Field of Classification Search
CPC .................................................. H01L 23/482
See application file for complete search history.

(56) References Cited

U.S. PATENT DOCUMENTS

| 5,177,134 | A  | 1/1993 | Mullen, III |
| 6,367,150 | B1 | 4/2002 | Kirsten |
| 6,570,029 | B2 | 5/2003 | Wang |

(Continued)

FOREIGN PATENT DOCUMENTS

| CN | 105280596 A   | 1/2016 |
| WO | WO2016111142 A1 | 7/2016 |

OTHER PUBLICATIONS

Anonymous. General Soldering Temperature Process Guidelines. NXP Semiconductors Application Note. Aug. 2017. 4 pages.
(Continued)

*Primary Examiner* — William A Harriston
(74) *Attorney, Agent, or Firm* — Daniel Morris; Otterstedt & Kammer PLLC

(57) ABSTRACT

A lidded chip package apparatus has reduced latent thermal stress in an under-chip high-CTE layer of the chip package because the lid of the package was adhered to a substrate of the package and cured during a same thermal excursion as when underfill was dispensed and cured under a chip of the package, and the chip package was cooled from the combined underfill and lidding process to room temperature with the lid adhered to the chip and the substrate, thereby reducing latent thermal stress in the under-chip high-CTE layer of the chip package.

20 Claims, 7 Drawing Sheets

(51) Int. Cl.
    *H01L 21/56*         (2006.01)
    *H01L 23/00*         (2006.01)

(56) References Cited

U.S. PATENT DOCUMENTS

| | | | |
|---|---|---|---|
| 6,796,481 | B2 | 9/2004 | Yamauchi |
| 6,919,224 | B2 | 7/2005 | Sane |
| 6,949,404 | B1 * | 9/2005 | Fritz ................... H01L 21/50 |
| | | | 438/106 |
| 7,087,458 | B2 | 8/2006 | Wang |
| 7,588,968 | B1 | 9/2009 | Zarbock |
| 9,613,888 | B2 | 4/2017 | Yoneyama |
| 9,860,996 | B2 | 1/2018 | Interrante |
| 9,875,986 | B2 | 1/2018 | Sakuma |
| 9,890,244 | B2 | 2/2018 | Tsang |
| 2001/0028109 | A1 | 10/2001 | Shimizu |
| 2009/0098666 | A1 | 4/2009 | Hering |
| 2011/0309481 | A1 * | 12/2011 | Huang ................ H01L 21/563 |
| | | | 257/659 |
| 2012/0318854 | A1 | 6/2012 | Tsang |
| 2019/0326161 | A1 | 10/2019 | Kelly |
| 2020/0219786 | A1 | 7/2020 | Hung |

OTHER PUBLICATIONS

Anonymous. Semiconductor Packaging. Nordson Electronics Solutions. Dec. 2020. 2 pages.
A. Mackie. Thermocompression Bonding for Microbump Flip-Chip Soldering. Indium Corp. Blogs. Jun. 2011. 5 pages.
Anonymous. Low Temperature Solder Bonding. Shinko Electric Industries Co, Ltd. Dec. 2020. 3 pages.
R. Made et al., Study of Low-Temperature Thermocompression Bonding in Ag-In Solder for Packaging Applications. J. Electronic Materials. Oct. 2008. 7 pages.
K. Sakuma et al., Assembly of a Chip to a Substrate, U.S. Appl. No. 17/139,298, filed Dec. 2020. 27 pages.
K. Sakuma et al., Fluxless Bonding for Fine-pitch and Low-volume Solder 3-D Interconnections. Proc 2011 Electronic Components and Technology Conference. May 2011. 7 pages.
A. Harrison, IBM Appendix P, Dec. 2020, 2 pages.
United Kingdom Intellectual Property Office, Combined Search and Examination Report, related British application GB2117762.1, 8 pages total, dated May 19, 2022.

* cited by examiner

MITIGATING COOLDOWN PEELING STRESS DURING CHIP PACKAGE ASSEMBLY

BACKGROUND

The present invention relates to the electrical, electronic, and computer arts, and more specifically, to assembly of integrated circuit chip packages.

During fabrication of integrated circuit chip packages, the chips and substrates experience repeated thermal excursions as they alternately are heated to process temperatures (e.g., underfill dispense and cure, lidding adhesive cure) then cooled to room temperature for handling. Thermal excursions introduce thermomechanical stresses to various layers of the chips, especially during cooldowns to room temperature when high-coefficient-of-thermal-expansion (high-CTE) chip layers experience a peeling stress due to differential contraction relative to other layers.

SUMMARY

Principles of the invention provide techniques for mitigating cooldown peeling stress during chip package assembly.

In one aspect, an exemplary method includes mitigating cooldown peeling stress in a high-CTE layer of a chip package. The method mitigates cooldown peeling stress by obtaining a chip package that includes a chip mounted to a substrate; warming the chip package to an underfill process temperature; dispensing underfill between the chip and the substrate; curing the underfill by holding the chip package at the underfill process temperature; lidding the chip package while holding the chip package at or above the underfill process temperature; and, subsequently, cooling the lidded chip package to room temperature.

According to another aspect, a lidded chip package apparatus includes a substrate, a chip bonded to the substrate, underfill cured between the chip and the substrate, and a lid adhered to the chip and the substrate. The chip includes the under-chip high-CTE layer at an underside of the chip facing the substrate. Latent thermal stress in the under-chip high-CTE layer of the chip package is less than a yield stress value; for example, the stress is reduces as compared to prior-art techniques because the lid was adhered to the substrate and cured during a same thermal excursion as when the underfill was dispensed and cured, and the chip package was cooled from the combined underfill and lidding process to room temperature with the lid adhered to the chip and the substrate, thereby reducing latent thermal stress in the under-chip high-CTE layer of the chip package.

In view of the foregoing, techniques of the present invention can provide substantial beneficial technical effects. For example, one or more embodiments provide one or more of:

Reduced residual thermal stresses during operation of a lidded chip package.

Reduced likelihood of cooldown peeling during fabrication of a lidded chip package.

These and other features and advantages of the present invention will become apparent from the following detailed description of illustrative embodiments thereof, which is to be read in connection with the accompanying drawings.

DETAILED DESCRIPTION

Figure 1:
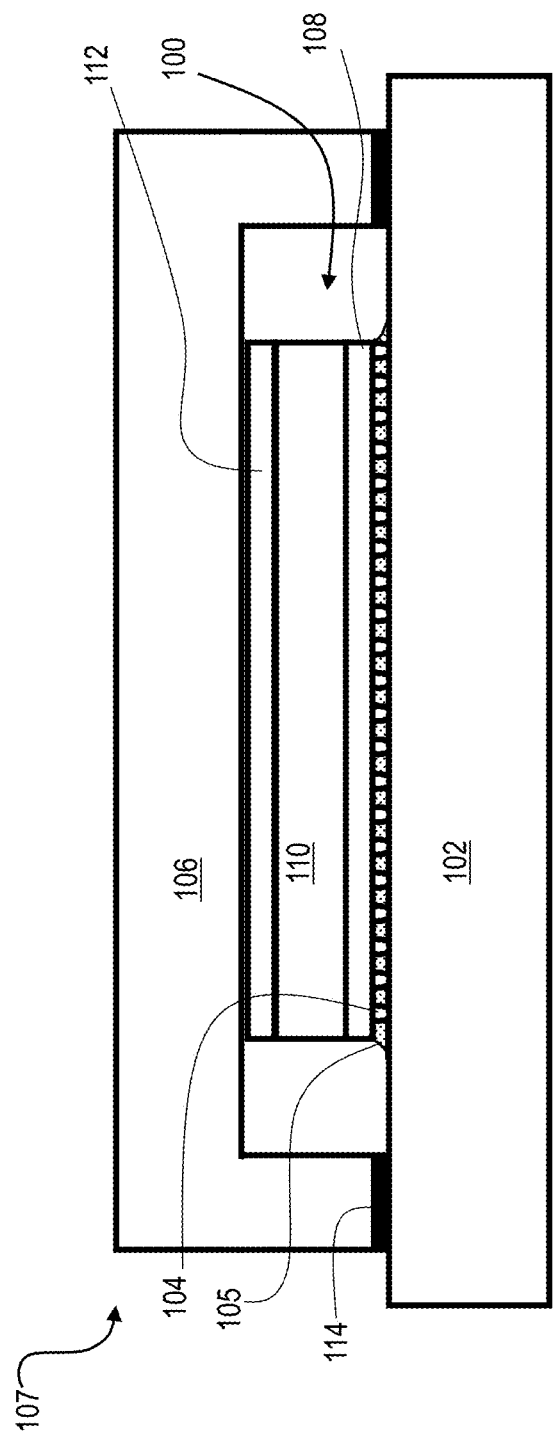
FIG. 1 depicts a side section view of a chip package with a lid.

FIG. 1 shows a side section view of a chip 100 attached to a board 102 by controlled collapse chip connection (C4) solder balls 104 under a lid 106 (together, a "chip package" 107). Underfill 105 fills gaps between the C4 balls 104, and absorbs strain between the substrate 102 and the chip 100. The chip 100 includes a high-coefficient-of-thermal-expansion (high-CTE) layer or a material 108 between bulk silicon 110 and the C4 balls 104. In one or more embodiments, the high-CTE layer 108 has a CTE in excess of $10 \times 10^{-6}$/K. In one or more embodiments, the high-CTE layer 108 comprises aluminum, which has a CTE of about $23 \times 10^{-6}$/K. In one or more embodiments, thermal interface material (TIM) 112 is provided between the chip 100 and the lid 106. The TIM 112 may be, for example, a polymer gel with conductive fillers, a graphite pad, a metal pad, or a combination graphite/metal pad. In one or more embodiments, the TIM 112 is adhered between the chip 100 and the lid 106 and transfers shear stress from the chip 100 to the lid 106. An adhesive 114 seals the lid 106 to the package 107.

Conventional chip package production includes chip join, underfill dispense and cure, and lidding as three separate high temperature (>110° C.) thermal processes that are separated by room temperature (RT) (about 20° C. to 25° C.) thermal excursions (cooldowns). Thus, after chip join, a package is cooled to RT, heated to underfill dispense and cure temperature, cooled again to RT, heated to lidding temperature, and then cooled to RT.

Figure 8:
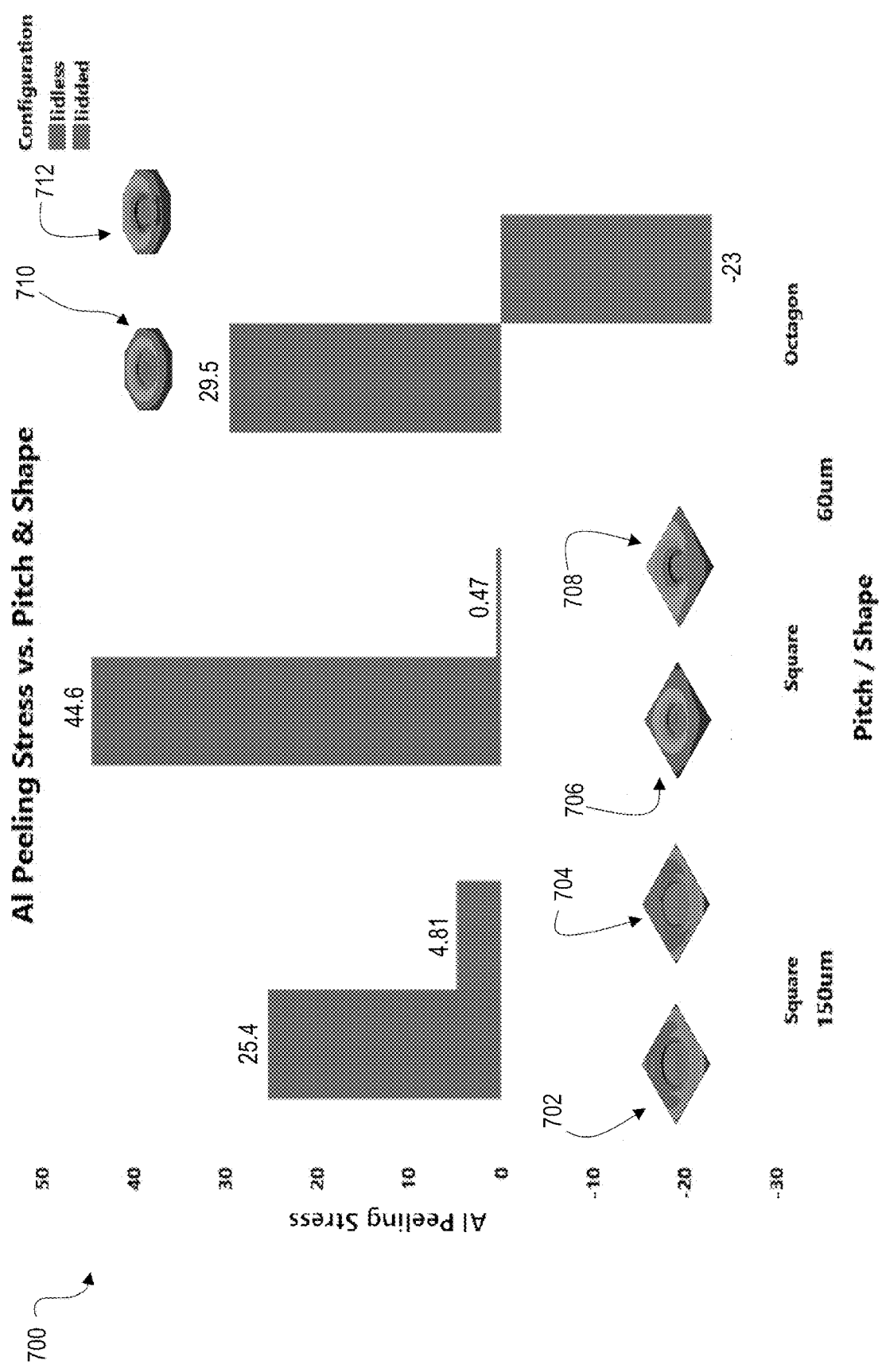
FIG. 8 depicts in color a graph of cooldown peeling stress maximum values for high-CTE layers of chip packages having various shapes and C4 pitches, with and without attached lid.

During each cooldown, the high-CTE layer 108 suffers peeling stress (i.e. forces that tend to peel it away from the bulk silicon 110) due to differing coefficients of thermal expansion (CTEs) among the board 102, the high-CTE layer 108, and the bulk silicon 110. The peeling stress is most severe during the cooldown after underfill dispense and cure. Once lidding has been done, adhesion between the bulk silicon 110 and the lid 106 mitigates peeling stress on the high-CTE layer 108 by redistributing some of the thermomechanical strain. This effect is illustrated in FIG. 8, below.

Figure 2:
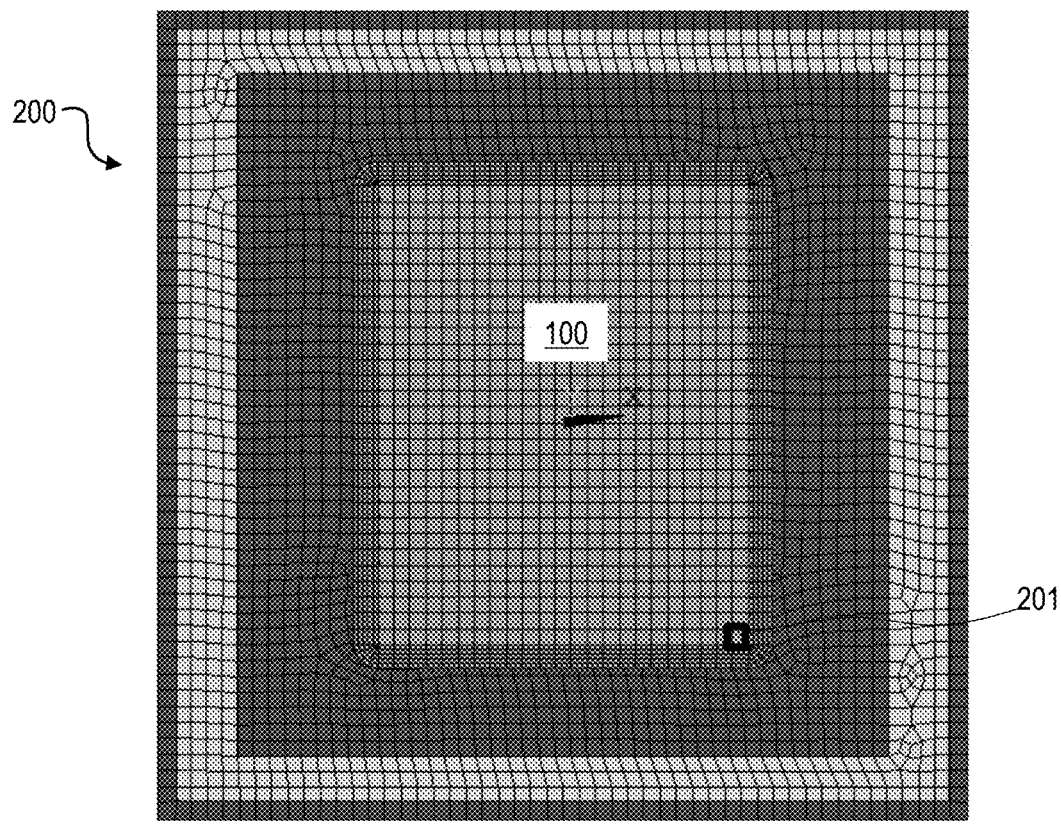
FIG. 2 depicts in grayscale a top view of a finite element model of a chip package with controlled collapse chip connection (C4) pitch less than 200 μm, without a lid.

FIG. 2 depicts a top view of a finite element model of a chip package 200 with C4 pitch less than 200 μm (e.g., 150 μm), without a lid. The chip package 200 includes a corner portion 201 of the chip 100; the corner portion 201 is shown in detail in FIG. 3.

Figure 3:
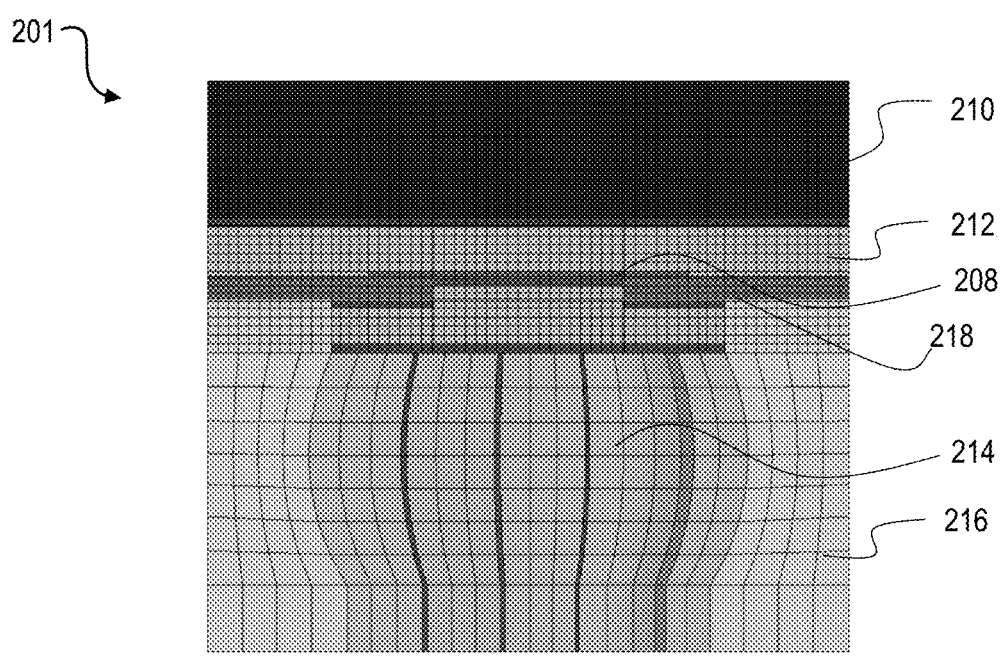
FIG. 3 depicts in grayscale a side view of a portion of the finite element model of C4 used in FIG. 2.

FIG. 3 depicts a side view of the corner portion 201 of the finite element model of the chip package 200 with 150 μm C4 pitch, lid not shown. The chip package portion 201 includes bulk silicon 210, high-CTE layer 208, an oxide layer 212, a controlled collapse chip connection (C4) solder ball 214, and underfill 216. Optionally, the chip package 201 may include a polyimide layer 218.

Figure 4:
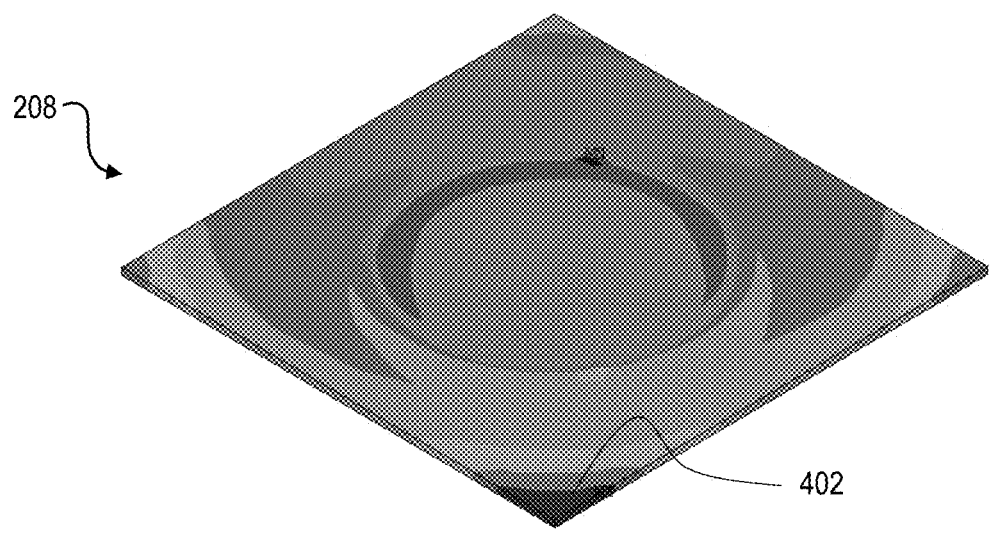
FIG. 4 depicts in grayscale a perspective view of peeling stress calculated for a high-CTE layer of the finite element model of FIG. 2 during cooldown after underfill dispense and cure.

FIG. 4 depicts a perspective view of peeling stress calculated for the high-CTE layer 208 of the finite element model of FIG. 2 during a standard cooldown after underfill dispense and cure. The cooldown is natural cooling from a cure temperature (between about 110° C. and 160° C.) to room temperature. In FIG. 4, note region 402 where the peeling stress exceeds a permissible design value (i.e., the stress will cause peeling).

Figure 5:
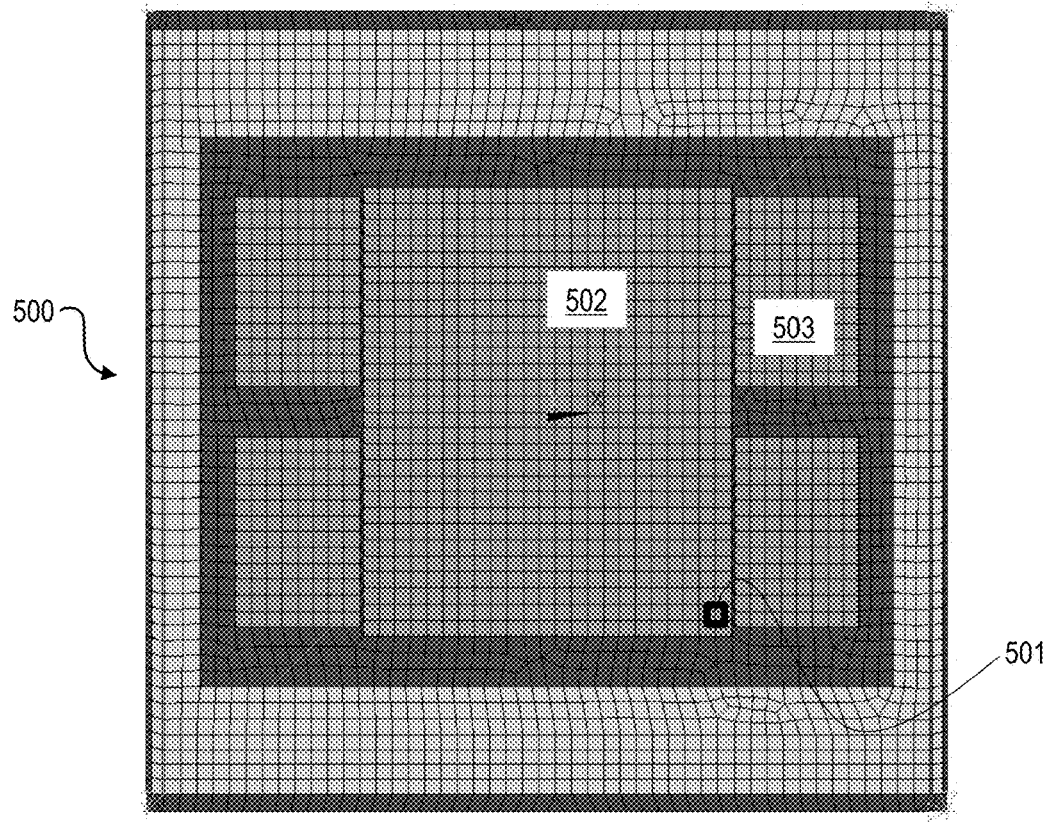
FIG. 5 depicts in grayscale a top view of a finite element model of a chip package with C4 or micro-bump (solder-capped copper/nickel pedestals or pillars) with a pitch of less than 100 μm, showing high bandwidth memory (HBM) and a chip attached to the package, without a lid.

FIG. 5 depicts a top view of a finite element model 500 of a chip package with 60 μm micro-bump pitch, without a lid. The chip package includes a chip 502 with high bandwidth memory (HBM) 503 attached to the chip 502. The chip 502 includes a corner portion 501.

Figure 6:
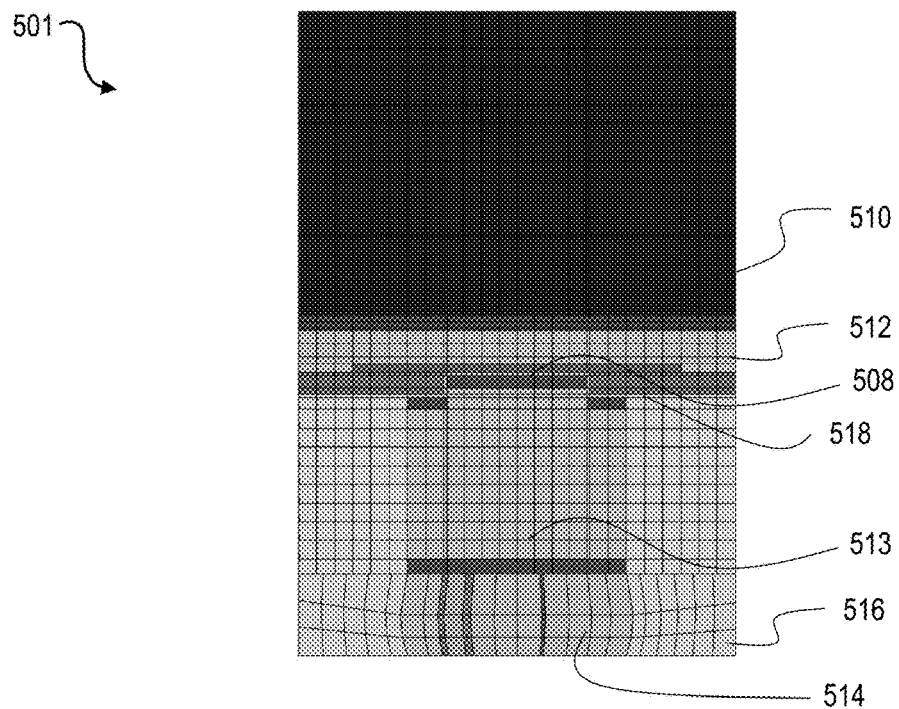
FIG. 6 depicts in grayscale a side view of the finite element model of micro-bump used in FIG. 5.

FIG. 6 depicts a side view of a finite element model of the chip package corner portion 501 with a high-CTE layer 508, an oxide layer 512, a copper pillar 513, a solder 514, and underfill 516. Optionally, the chip package 500 may include a polyimide layer 518. Note also bulk silicon 510.

Figure 7:
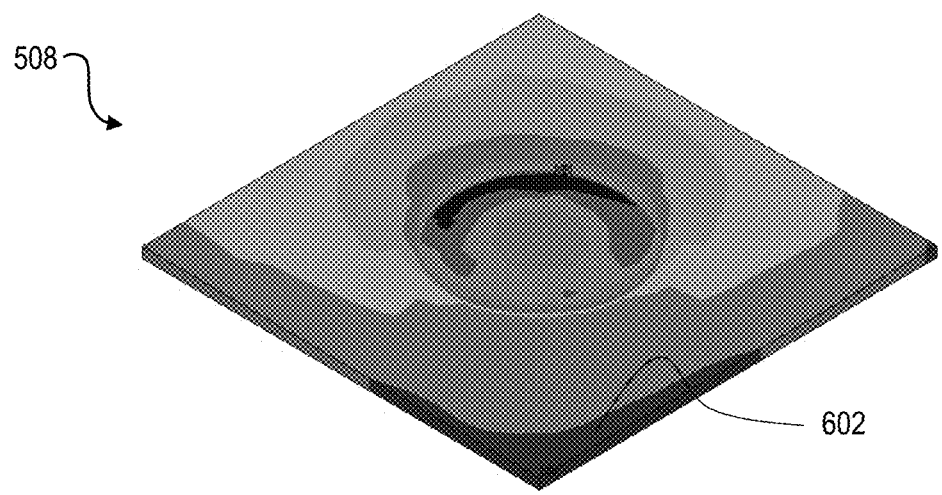
FIG. 7 depicts in color a perspective view of peeling stress calculated for a high-CTE layer of the finite element model of FIG. 6 during cooldown after underfill dispense and cure.

FIG. 7 depicts a perspective view of peeling stress calculated for the high-CTE layer 508 of the finite element model of FIG. 6 during standard cooldown after underfill dispense and cure. In FIG. 7, note region 602 where the peeling stress exceeds a permissible design value.

FIG. 8 depicts a graph 700 of cooldown peeling stress maximum values for high-CTE layers of chip packages having various shapes and C4 pitches, with and without attached lid. At the left side of the graph 700, an unlidded chip package with a square shaped high-CTE material 702 has a large maximum tensile value for cooldown peeling stress. A lidded chip package with a square shaped high-CTE material 704 has a smaller maximum tensile value for cooldown peeling stress. At the middle of the graph 700, an unlidded chip package with a square shaped high-CTE material 706 has a large maximum tensile value for cooldown peeling stress. A lidded chip package with a square shaped high-CTE material 708 has a smaller maximum tensile value for cooldown peeling stress. At the right side of the graph, an unlidded chip package with an octagonal shaped high-CTE material 710 has a large maximum tensile value for cooldown peeling stress. A lidded chip package with an octagonal shaped high-CTE material 712 has a large maximum compressive value for cooldown peeling stress (i.e., no peeling stress). The bar graphs above each package show the stress values within the high-CTE material. Views 702, 704, 706, 708, 710, 712 are shown in a relatively small size as exemplary of a user interface. FIGS. 4 and 7 are examples of how enlarged stress plots appear.

Considering the results of FIG. 8, we have found that cooldown peeling stress could be substantially mitigated by lidding a chip package during the same temperature excursion as underfill dispense and cure, i.e., without cooling down to RT between underfill and lidding processes.

Figure 9:
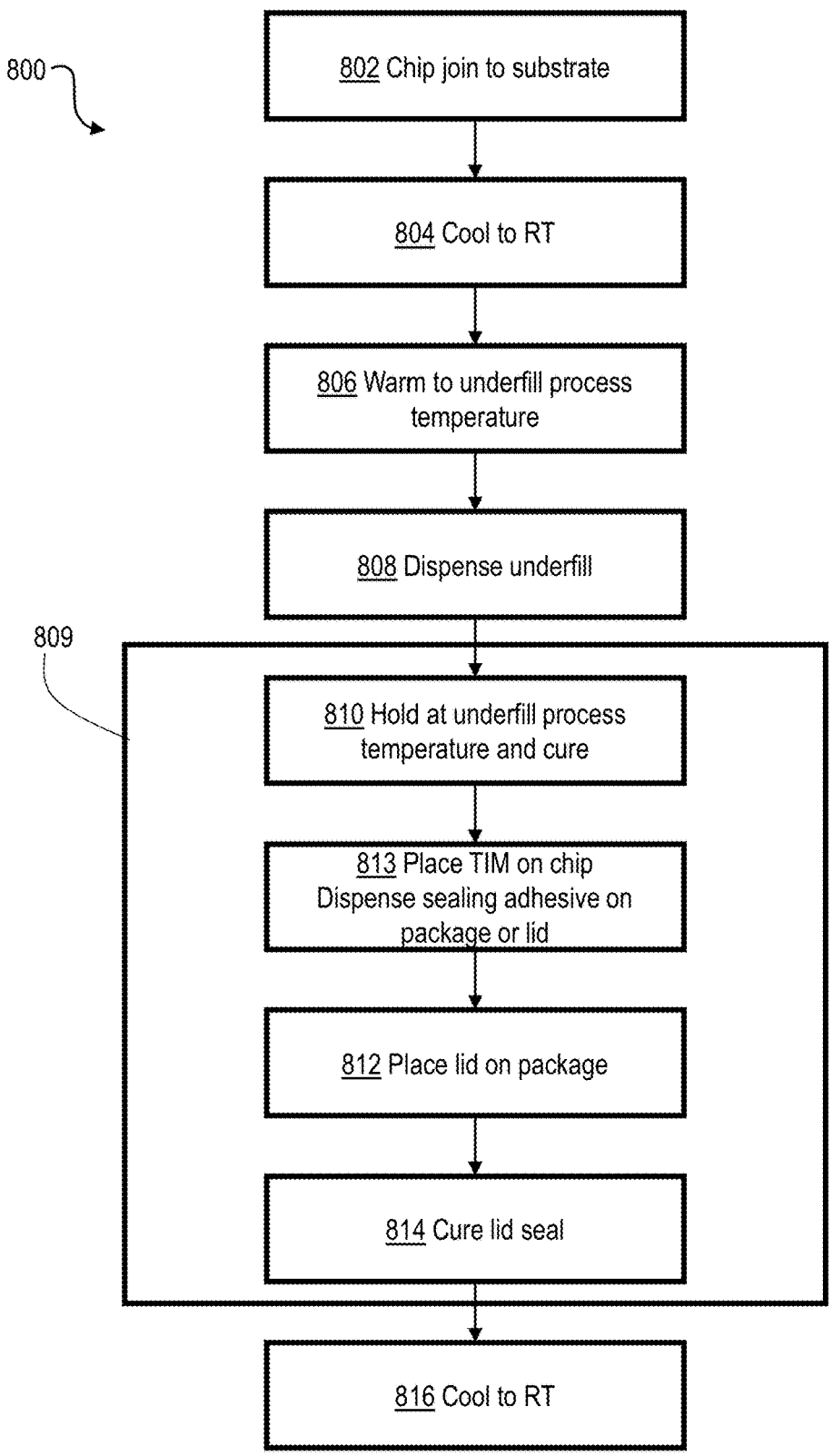
FIG. 9 depicts in a flowchart steps of a method for mitigating cooldown peeling stress in a chip package, according to an exemplary embodiment.

Accordingly, FIG. 9 depicts in a flowchart steps of a method 800 for mitigating cooldown peeling stress. At 802, join the chip 100 to the substrate 102 (typically at 235° C. to 245° C.). At 804, cool to room temperature. At 806, warm to underfill process temperature (typically 110° C. to 160° C.). At 808 dispense the underfill 105. Box 809 indicates a period of holding the chip package at or above underfill dispense temperature. At 810, hold at underfill cure temperature for 15 minutes to 120 minutes. At 812, optionally during underfill cure, place the lid 106 on the package. At 813 dispense sealing adhesive 114 on the package 107 or on the lid 106 and, optionally, place thermal interface material (TIM) 112 between the chip 100 and lid 106. At 814, cure the adhesive 114 (and, optionally, the TIM 112) at 150° C. to 170° C. At 816, cool to RT. During the cooldown to room temperature, the lid 106, the TIM 112, and the adhesive 114 distribute thermomechanical strain from the substrate 102 to the chip 100 so that peeling stress on the high-CTE layer 108 of the chip 100 is reduced or eliminated relative to an unlidded cooldown. Further, cooldown peeling stress can be mitigated by changing the shape of the high-CTE layer/material within the chip package (i.e., chip packages with octagonal high-CTE materials have lower cooldown peeling stress than do chip packages with square high-CTE materials).

The high-CTE layer 108 can be made, for example, of aluminum or copper and could have, for example, any of the following shapes: Square, rectangular, octagonal or circular. Copper can be deposited using the dual-damascene process. Since this is an expensive process, aluminum is used in one or more embodiments to reduce cost.

In one or more embodiments, the UF 105 is dispensed on the edges of device, and capillary action (due to small gaps in the C4 array) will draw the material into the C4 array area. A fillet will form around the device, usually about half way up the side/edge of the device (silicon 'wall'). This aspect is typically process driven by the material and dispensing tool speed, position and speed.

Given the discussion thus far, it will be appreciated that, in general terms, an exemplary method 800, according to an aspect of the invention, is directed to mitigating cooldown peeling stress in a high-CTE layer of a chip package. Obtain a chip package 107 that includes a chip 100 mounted to a substrate 102. At 806, warm the chip package to an underfill process temperature. At 808, dispense underfill 105 between the chip and the substrate. At 810, cure the underfill by holding the chip package at the underfill process temperature. At 812 and 814, lid the chip package while holding the chip package at or above the underfill process temperature. Subsequently, at 816, cool the lidded chip package to room temperature.

In one or more embodiments, the underfill process temperature is between 110° C. and 160° C. In one or more embodiments, the chip package is held at the underfill process temperature for between 15 minutes and 120 minutes. In one or more embodiments, the chip package is warmed from the underfill process temperature to a lid cure temperature of at least 160° C. before lidding.

In one or more embodiments, lidding the chip package includes, at 814, curing an adhesive 114 between the lid and the chip package while holding the lidded chip package at or above the underfill process temperature.

In one or more embodiments, the method also comprises at 802 mounting the chip to the substrate using C4 balls 104 at a pitch less than 200 μm.

In one or more embodiments, the method also comprises at 802 mounting the chip to the substrate by solder-capped copper/nickel pillars at a pitch less than 100 μm. In one or more embodiments, the method also comprises mounting the chip to the substrate by solder-capped copper/nickel pillars at a pitch less than 60 µm.

In one or more embodiments, the method also comprises at 813 adhering thermal interface material (TIM) between the chip and the lid.

In one or more embodiments, the method also comprises distributing thermal stress from the substrate to the chip via the lid, adhesive, and TIM during cooldown to room temperature.

According to another aspect, a lidded chip package apparatus 107 includes a substrate 102; a chip 100 bonded to the substrate; underfill 105 cured between the chip and the substrate; and a lid 106 adhered to the chip and the substrate. The chip includes an under-chip high-CTE layer 108 at an underside of the chip facing the substrate. Latent thermal stress in the under-chip high-CTE layer of the chip package is less than a yield stress value; i.e., is sufficiently low such that peeling does not occur. This can be determined, for example, via finite element stress analysis as discussed herein.

In one or more embodiments, latent thermal stress in the under-chip high CTE layer 108 is reduced as compared to prior art techniques because the lid 106 was adhered to the substrate 102 and cured during the same thermal excursion as when the underfill 105 was dispensed and cured, and the chip package 107 was cooled from the combined underfill and lidding process to room temperature with the lid 106 adhered to the chip 100 and the substrate 102, thereby reducing latent thermal stress in the under-chip high-CTE layer 108 of the chip package.

In one or more embodiments, the underfill was dispensed and cured at a temperature between 110° C. and 160° C. and the apparatus was maintained at or above the underfill dispense and cure temperature while the lid was adhered to the chip and to the substrate. In one or more embodiments, the apparatus was maintained at the underfill temperature for between 15 minutes and 120 minutes. In one or more embodiments, the apparatus was warmed to a lidding temperature of at least 160° C. before adhering the lid to the chip and to the substrate.

In one or more embodiments, the chip is bonded to the substrate by C4 balls 104 at a pitch less than 200 µm.

In one or more embodiments, the chip is bonded to the substrate by solder-capped copper/nickel pillars at a pitch less than 100 µm.

In one or more embodiments, the chip is bonded to the substrate by solder-capped copper/nickel pillars at a pitch less than 60 µm.

In one or more embodiments, the apparatus also comprises high bandwidth memory 503 bonded to the substrate next to the chip.

In one or more embodiments, the apparatus also comprises a thermal interface material (TIM) adhered between the chip and the lid. In one or more embodiments, the TIM is a polymer gel with conductive fillers. In one or more embodiments the TIM is one of a graphite pad, a metal pad, and a graphite/metal combination pad.

In one or more embodiments, the high-CTE layer comprises aluminum. In one or more embodiments, the high-CTE layer has a coefficient of thermal expansion in excess of $10 \times 10^{-6}$/K.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for mitigating cooldown peeling stress in a high-CTE layer of a chip package, the method comprising:
   obtaining a chip package that includes a chip mounted to a substrate;
   warming the chip package to an underfill process temperature;
   dispensing underfill between the chip and the substrate;
   curing the underfill by holding the chip package at the underfill process temperature;
   lidding the chip package while holding the chip package at or above the underfill process temperature; and,
   subsequently, cooling the lidded chip package to room temperature.

2. The method of claim 1, wherein the underfill process temperature is between 110° C. and 160° C.

3. The method of claim 1, wherein the chip package is held at the underfill process temperature for between 15 minutes and 120 minutes.

4. The method of claim 1, wherein the chip package is warmed from the underfill process temperature to a lid cure temperature of at least 160° C. before lidding.

5. The method of claim 1, wherein lidding the chip package includes curing an adhesive between the lid and the chip package while holding the lidded chip package at or above the underfill process temperature.

6. The method of claim 1, further comprising mounting the chip to the substrate using C4 balls at a pitch less than 200 pm.

7. The method of claim 1, further comprising mounting the chip to the substrate by solder-capped copper/nickel pillars at a pitch less than 100 um.

8. The method of claim 1, further comprising mounting the chip to the substrate by solder-capped copper/nickel pillars at a pitch less than 60 um.

9. The method of claim 1, further comprising adhering thermal interface material (TIM) between the chip and the lid.

10. The method of claim 9, further comprising distributing thermal stress from the substrate to the chip via the lid, adhesive, and TIM during cooldown to room temperature.

11. A lidded chip package apparatus comprising:
    a substrate;
    a chip bonded to the substrate, wherein the chip includes an under-chip high-CTE layer at an underside of the chip facing the substrate;
    high bandwidth memory bonded to the substrate next to the chip;
    underfill cured between the chip and the substrate; and
    a lid adhered to the chip and the substrate.

12. The apparatus of claim 11, wherein the high-CTE layer has a coefficient of thermal expansion in excess of $10 \times 10^{6}$/K.

13. A lidded chip package apparatus comprising:
    a substrate;
    a chip bonded to the substrate, wherein the chip includes an under-chip high-CTE layer at an underside of the chip facing the substrate;
    underfill cured between the chip and the substrate; and
    a lid adhered to the chip and the substrate;

wherein latent thermal stress in the under-chip high-CTE layer of the chip package is less than a yield stress value.

14. The apparatus of claim 11, wherein the high-CTE layer comprises aluminum.

15. The apparatus of claim 11, wherein the chip is bonded to the substrate by C4 balls at a pitch less than 200 um.

16. The apparatus of claim 15, wherein the chip is bonded to the substrate by solder-capped copper/nickel pillars at a pitch less than 100 pm.

17. The apparatus of claim 15, wherein the chip is bonded to the substrate by solder-capped copper/nickel pillars at a pitch less than 60 um.

18. The apparatus of claim 11, further comprising a thermal interface material (TIM) adhered between the chip and the lid.

19. The apparatus of claim 18, wherein the TIM comprises a polymer gel with conductive fillers.

20. The apparatus of claim 18, wherein the TIM is one of a graphite pad, a metal pad, and a graphite/metal combination pad.

* * * * *